United States Patent
Tseng et al.

(10) Patent No.: US 7,397,065 B2
(45) Date of Patent: Jul. 8, 2008

(54) ORGANIC ELECTROLUMINESCENT DEVICE AND FABRICATION METHODS THEREOF

(75) Inventors: Chang-Ho Tseng, Taoyuan County (TW); Du-Zen Peng, Hsinchu County (TW); Yaw-Ming Tsai, Taichung County (TW)

(73) Assignee: TPO Displays Corp., Miao-Li County (TW)

( * ) Notice: Subject to any disclaimer, the term of this patent is extended or adjusted under 35 U.S.C. 154(b) by 84 days.

(21) Appl. No.: 11/381,213

(22) Filed: May 2, 2006

(65) Prior Publication Data

US 2007/0257250 A1 Nov. 8, 2007

(51) Int. Cl.
H01L 29/08 (2006.01)
H01L 33/00 (2006.01)

(52) U.S. Cl. .............................. 257/72; 257/40; 257/59; 257/79

(58) Field of Classification Search .................... 257/72, 257/59, 40, 79
See application file for complete search history.

(56) References Cited

U.S. PATENT DOCUMENTS

| | | | |
|---|---|---|---|
| 2003/0063081 A1* | 4/2003 | Kimura et al. | 345/211 |
| 2005/0007320 A1 | 1/2005 | Smith et al. | |
| 2006/0030084 A1* | 2/2006 | Young | 438/149 |
| 2007/0236429 A1* | 10/2007 | Tseng et al. | 345/81 |

FOREIGN PATENT DOCUMENTS

| | | |
|---|---|---|
| EP | 0923067 | 6/1999 |
| EP | 1122792 | 8/2001 |
| EP | 1096466 | 5/2005 |
| WO | WO 2004/019123 | 3/2004 |

OTHER PUBLICATIONS

"38.1: Optical Feedback for AMOLED Display Compensation Using LTPS and a-Si:H Technologies" Fish, et al., 2005, pp. 1340-1343.
"35.2: Improved Optical Feedback for AMOLED Display Differential Ageing Compensation" Fish, et al., 2004, pp. 1120-1123.
"32.1: Invited Paper: A Comparison of Pixel Circuits for Active Matrix Polymer/Organic LED Displays" Fish, et al., 2002, pp. 968-971.
"Optical Feedback in Active Matrix Polymer OLED Displays" Giraldo et al., 2003; pp. 529-530.
EPO Office Action mailed Oct. 27, 2006.

* cited by examiner

Primary Examiner—Ahmed Sefer
(74) Attorney, Agent, or Firm—Thomas, Kayden, Horstemeyer & Risley

(57) ABSTRACT

The invention discloses an organic electroluminescent device comprising a pixel element. The pixel element comprises a substrate comprising a control area and a sensitive area, a switch device and a driving device overlying the control area, a photo diode serving as a photo sensor overlying the sensitive area, an OLED element disposed in the sensitive area and illuminating to the photo sensor, and a capacitor coupled to the photo sensor and the driving device. Specifically, a photo current corresponding to a brightness of the OLED element is generated by the photo diode responsive to the OLED element illuminating the photo diode such that a voltage of the capacitor is adjusted by the photo current to control the current passing through the driving device, thus changing the illumination of the OLED element. A method for fabricating the OLED is also provided.

11 Claims, 18 Drawing Sheets

ORGANIC ELECTROLUMINESCENT DEVICE AND FABRICATION METHODS THEREOF

BACKGROUND OF THE INVENTION

1. Field of the Invention

The present invention relates to an organic electroluminescent device and fabrication methods thereof, and more particularly to compensation of an organic electroluminescent device.

2. Description of the Related Art

Organic electroluminescent devices are also known as organic light emitting diodes (OLED). A voltage is applied to an organic molecular material or polymer material to cause a device to emit light. Due to self emission characteristics of an OLED, dot matrix type displays with light weight, slim profile, high contrast, low power consumption, high resolution, fast response time, no backlight, and wide viewing angle can be achieved. Possible display parameters ranging from 4 mm micro-displays to 100 inch outdoor billboards make them a preferred light source for flat panel displays (FPD). If luminescent efficiency of the OLEDs is over 100 Lm/W, they can replace conventional lighting.

As shown in FIG. 1, an organic electroluminescent device is operated by a switch transistor 102, and a driving transistor 104 coupling to a power line Vp. Organic electroluminescent devices 106, however, suffer from non-uniform brightness between pixels. Specifically brightness of the organic electroluminescent device 106 decays with long term use.

BRIEF SUMMARY OF THE INVENTION

These and other problems are generally solved or circumvented, and technical advantages are generally achieved, by preferred illustrative embodiments of the present invention, which provide organic electroluminescent device.

One embodiment of the invention discloses an organic electroluminescent device comprising a pixel element. The pixel element comprises a substrate comprising a control area and a sensitive area, a switch device and a driving device overlying the control area, a photo diode serving as a photo sensor overlying the sensitive area, an OLED element disposed in the sensitive area and illuminating to the photo sensor, and a capacitor coupled to the photo sensor and the driving device. Specifically, a photo current corresponding to a brightness of the OLED element is generated by the photo diode responsive to the OLED element illuminating the photo diode such that a voltage of the capacitor is adjusted by the photo current to control the current passing through the driving device, thus changing the illumination of the OLED element.

Another embodiment of the invention discloses a fabrication method comprising the following: providing a substrate comprising a control area and a sensitive area; forming a first conductivity type TFT in the control area and a first conductivity type region of a photo diode in the sensitive area; and forming a second conductivity type TFT in the control area and a second conductivity type region of the photo diode in the sensitive area.

Other embodiments of the invention also disclose a panel or an electronic device incorporating the organic electroluminescent device.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
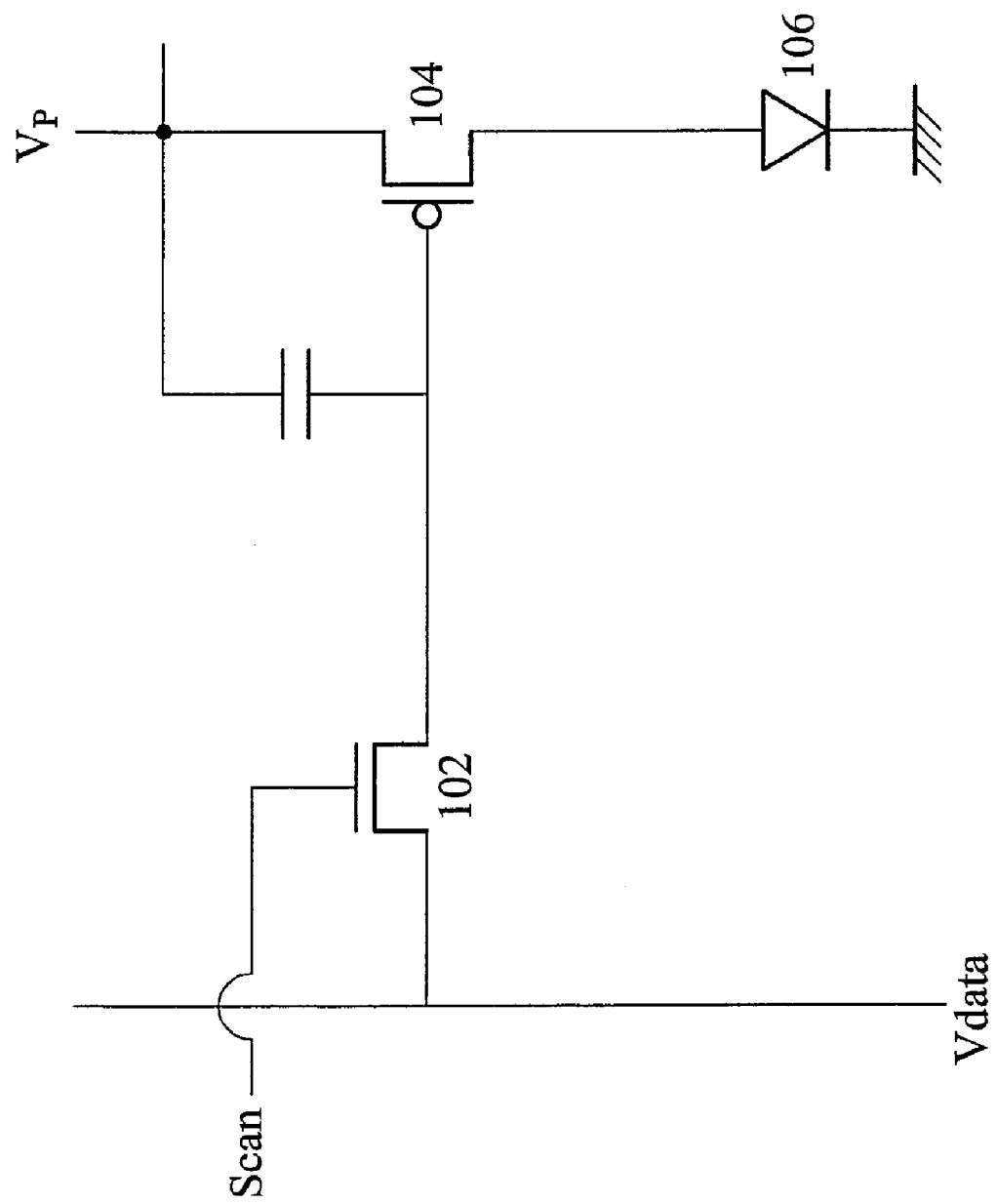
FIG. 1 illustrates non-uniform brightness between pixels of a conventional organic electroluminescent device.

The following description is of the best-contemplated mode of carrying out the invention. This description is made for the purpose of illustrating the general principles of the invention and should not be taken in a limiting sense. The scope of the invention is best determined by reference to the appended claims.

The invention will be described in greater detail by referring to the accompanying drawings. In the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

Figure 2:
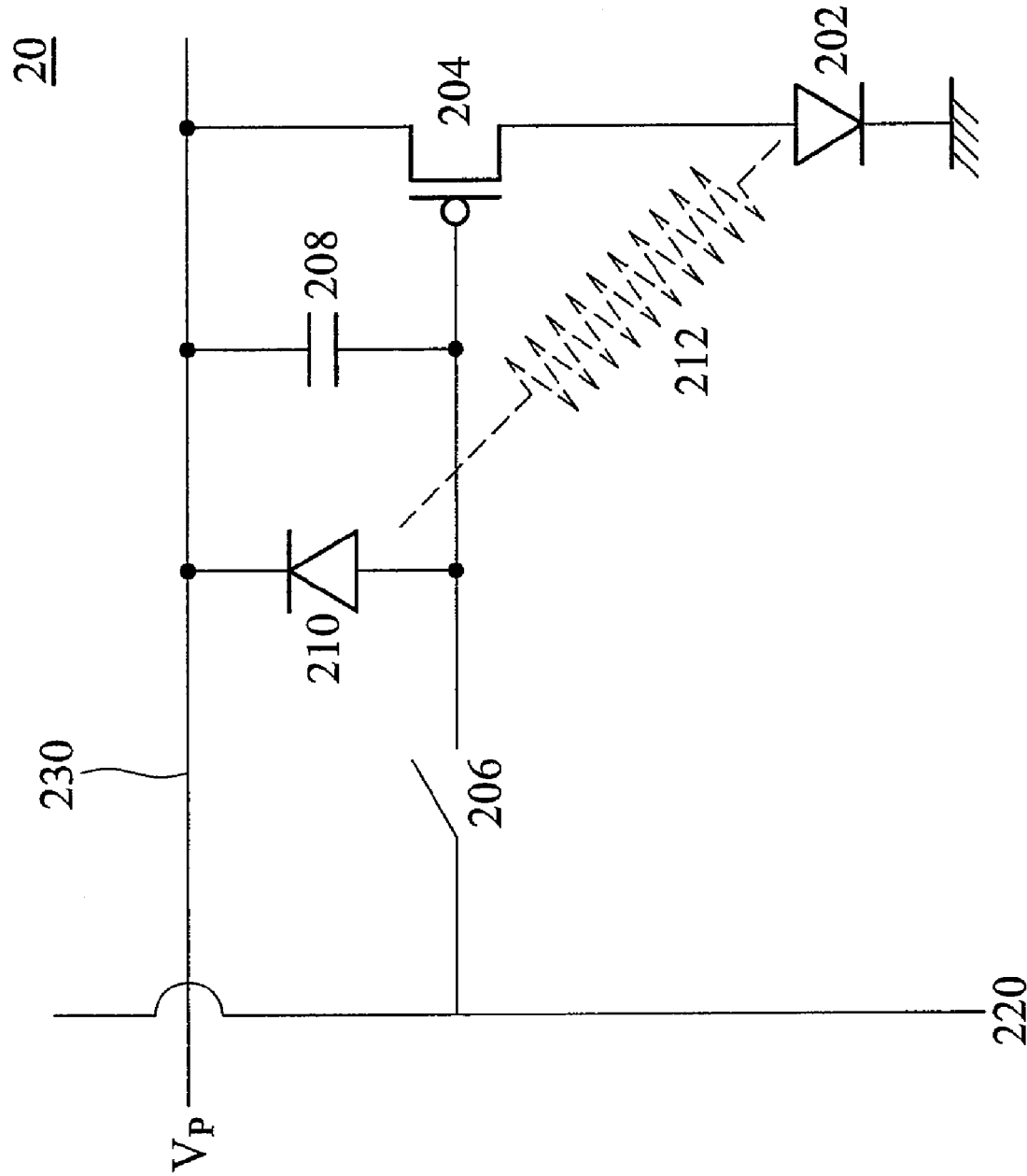
FIG. 2 shows an organic electroluminescent device with compensation device in accordance with an embodiment of the invention.

FIG. 2 shows an organic electroluminescent device with compensation device in accordance with an embodiment of the invention. Referring to FIG. 2, the electroluminscent device includes a pixel element 20. In the pixel element 20, an organic electroluminescent element 202 is operated by a switch device 206, such as a switch integrated circuit (IC) or a switch transistor, and a driving device 204 coupling to a power line $V_p$, also referred to as a driving integrated circuit, driving IC, in which current passing through the driving device 204 is controlled to determine illumination of the organic electroluminescent element 202. The switch device 206 is controlled by a column data line 220 and a row scan line 230. In an embodiment of the invention, a capacitor 208 can be coupled to a gate electrode of the driving device 204, in which the capacitor 208 further couples to a photo diode 210 (serving as a photo sensor). The voltage of the capacitor 208 is adjusted to control the current passing through the driving transistor 204 according to illumination of the organic electroluminescent element 202 detected by the photo sensor 210, thus, illumination 212 of the organic electroluminescent element 202 is changed for compensation.

Figure 3A:
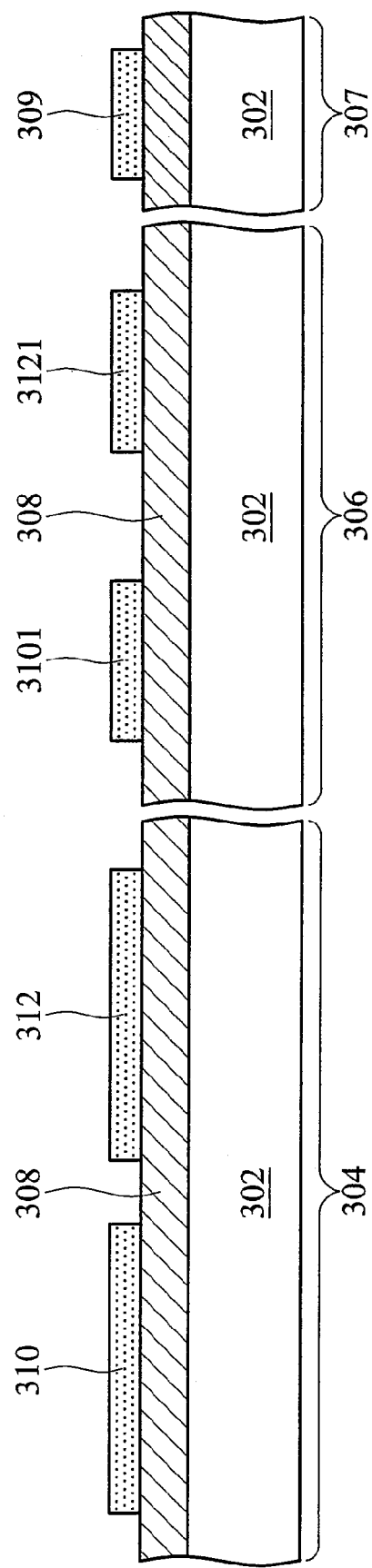
FIGS. 3A~3O show an intermediate cross section of an organic electroluminescent device with compensation device in accordance with an embodiment of the invention.
Figure 3B:
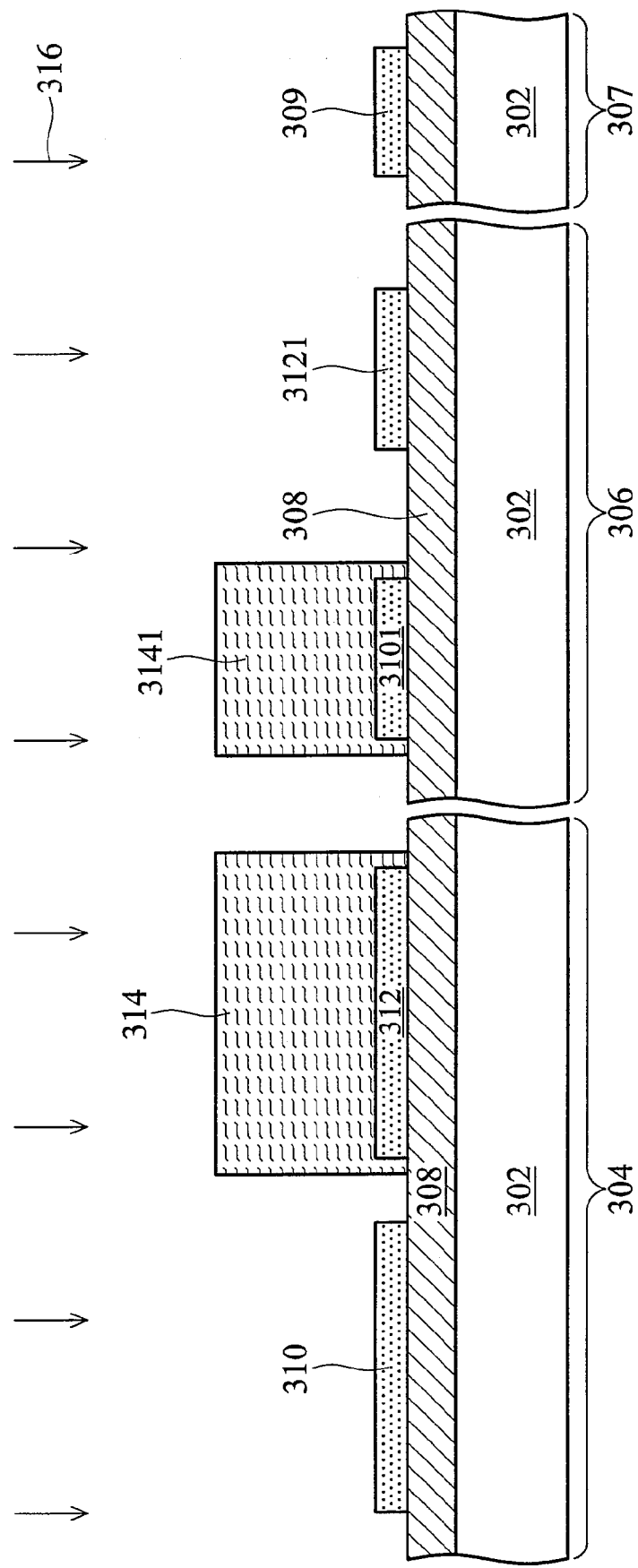
Figure 3C:
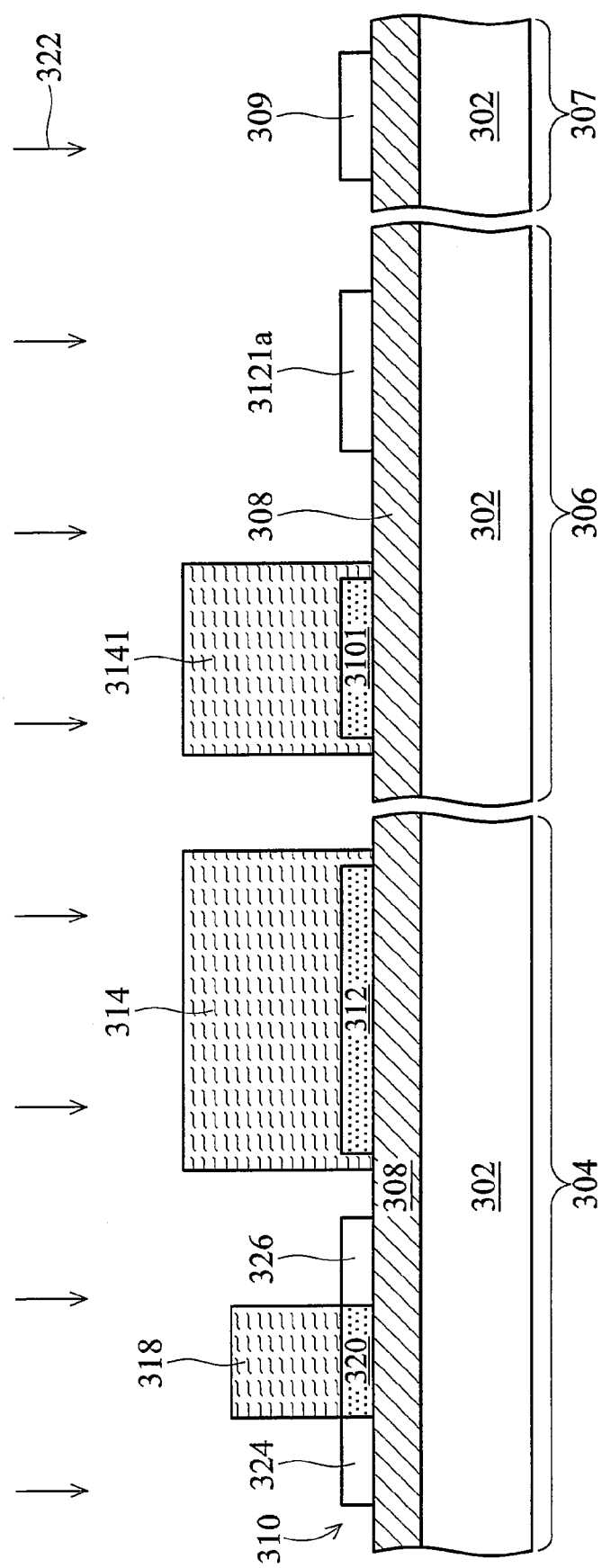
Figure 3D:
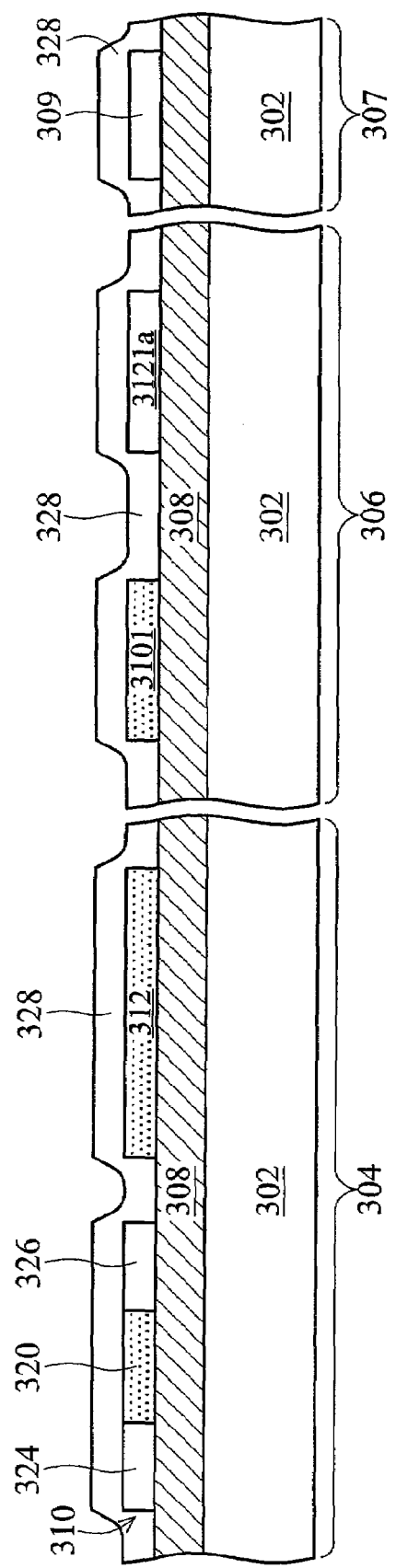
Figure 3E:
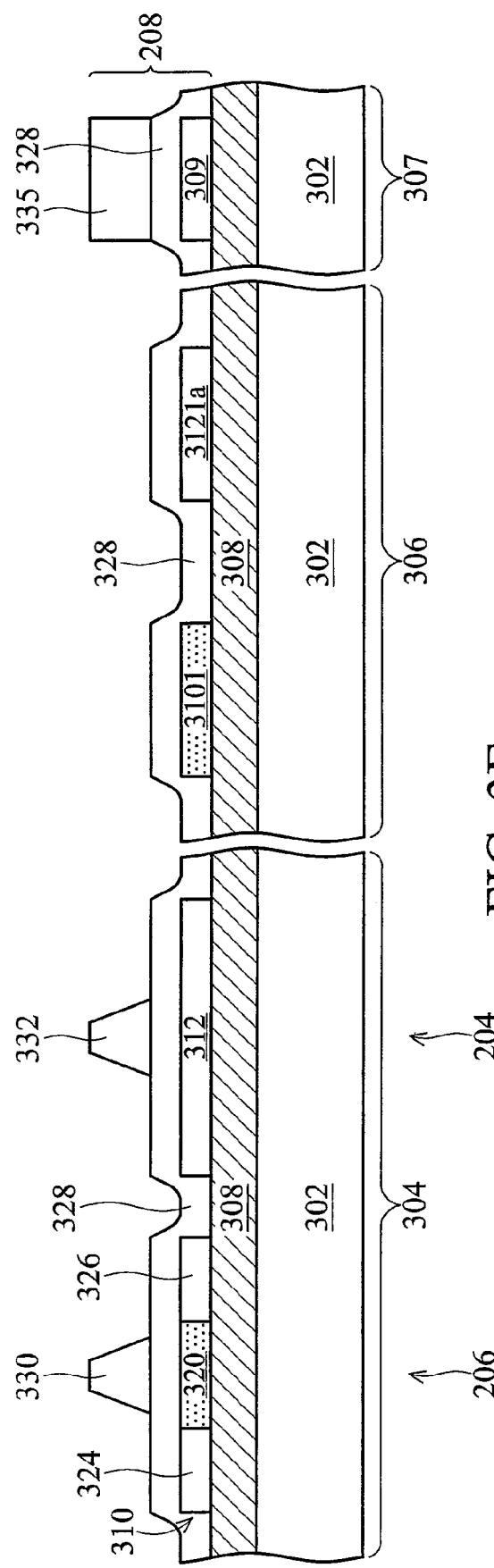
Figure 3F:
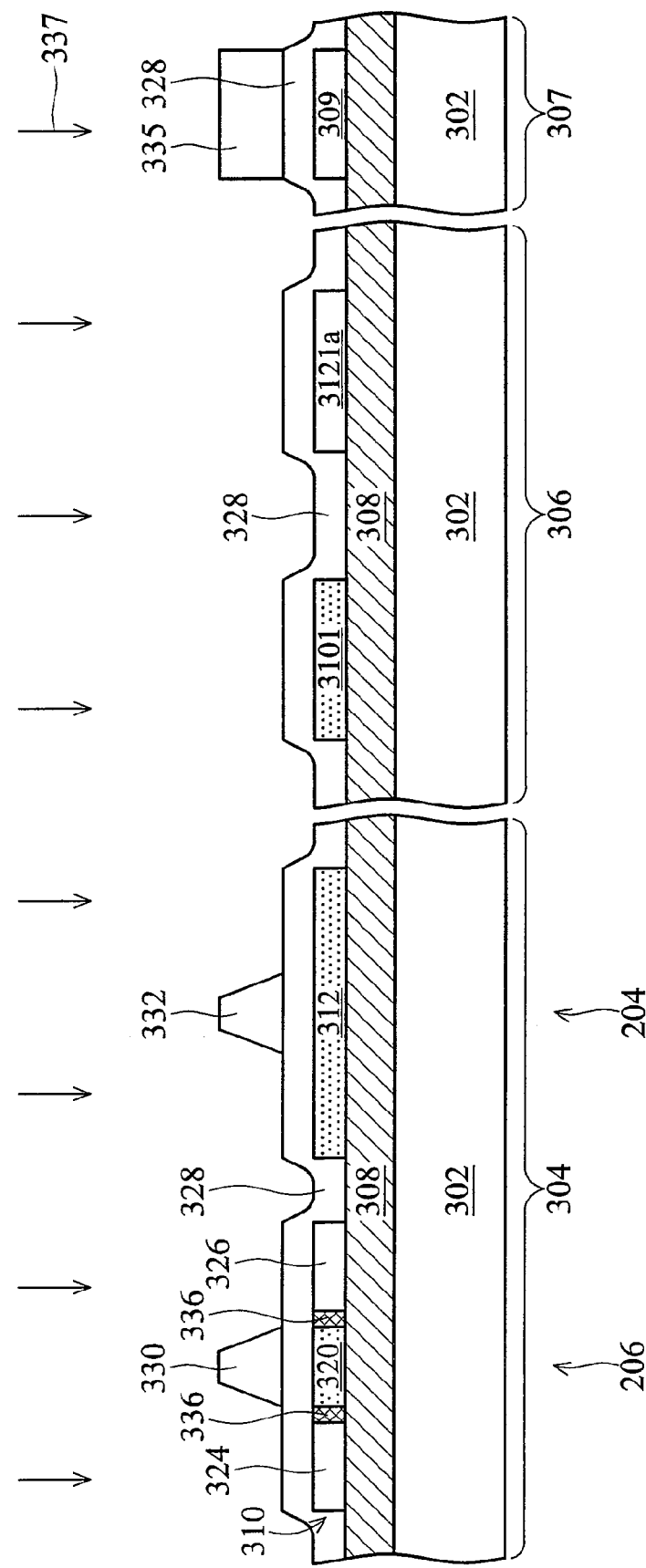
Figure 3G:
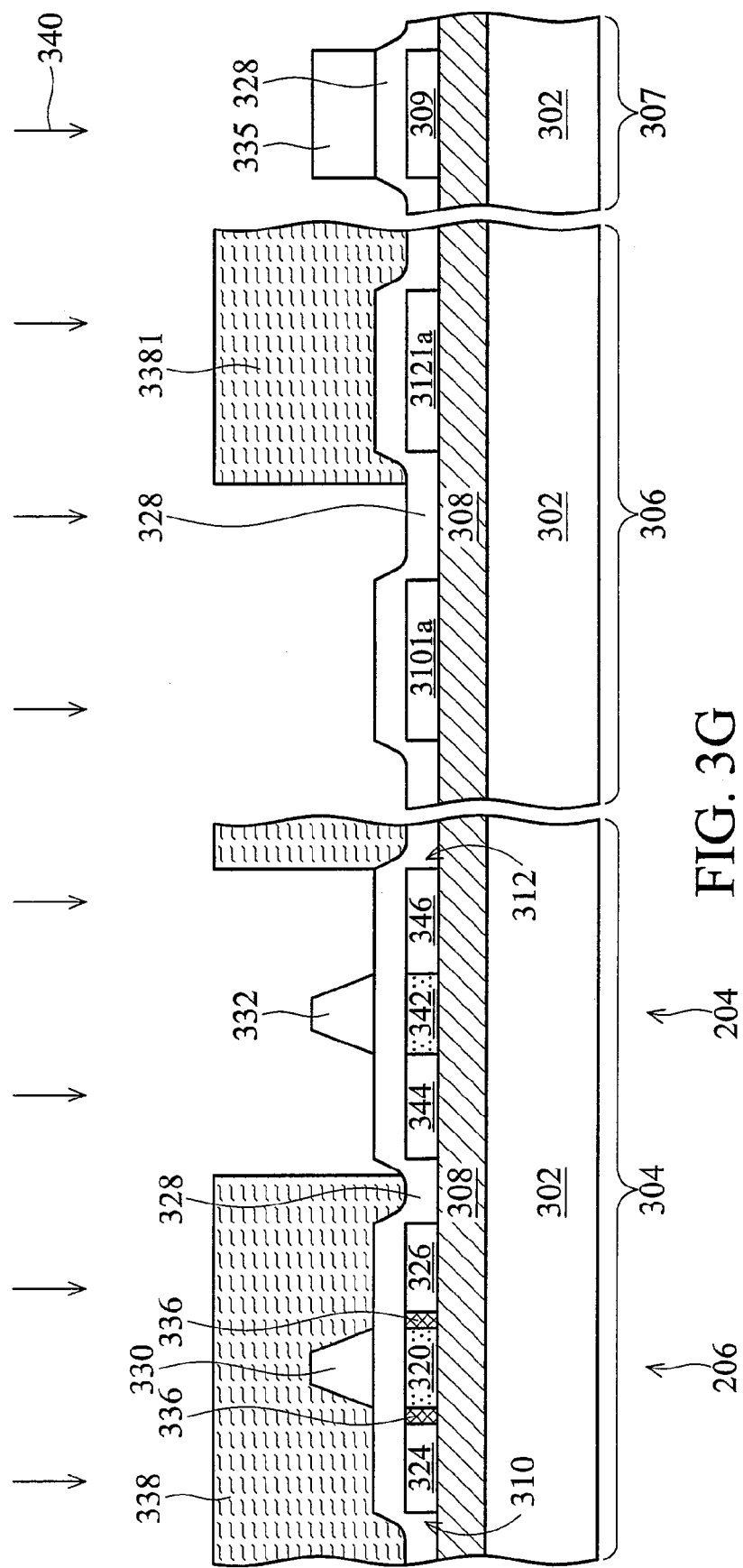
Figure 3H:
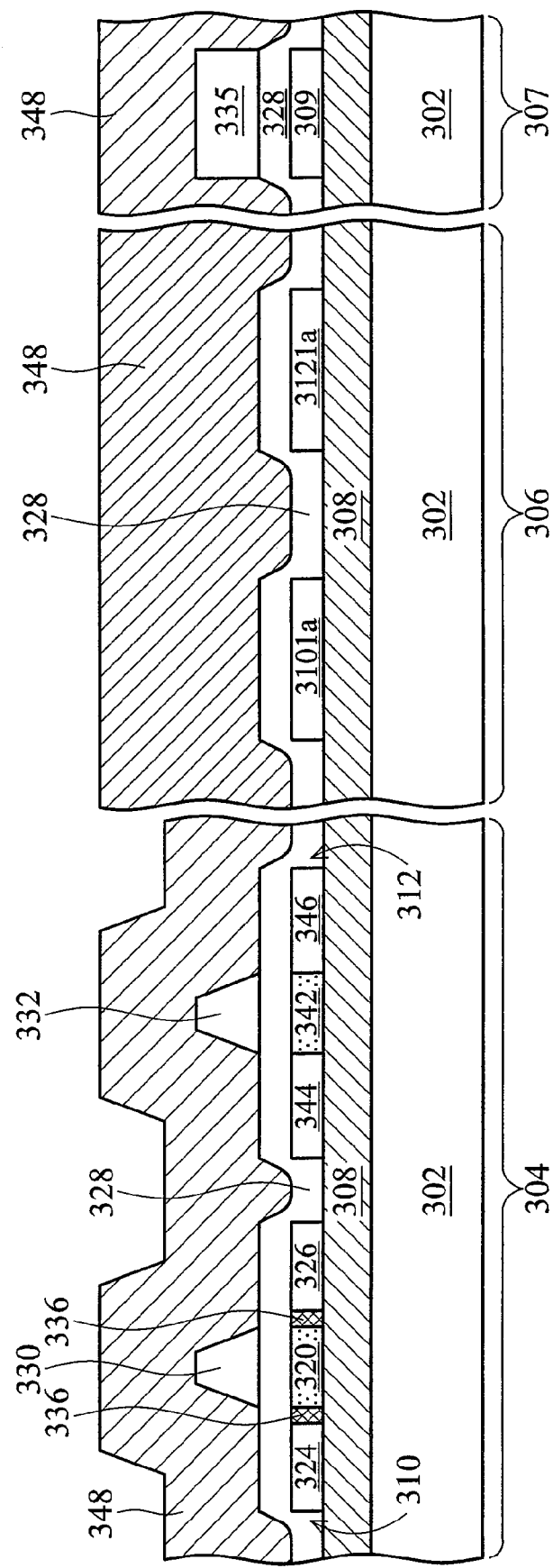
Figure 3I:
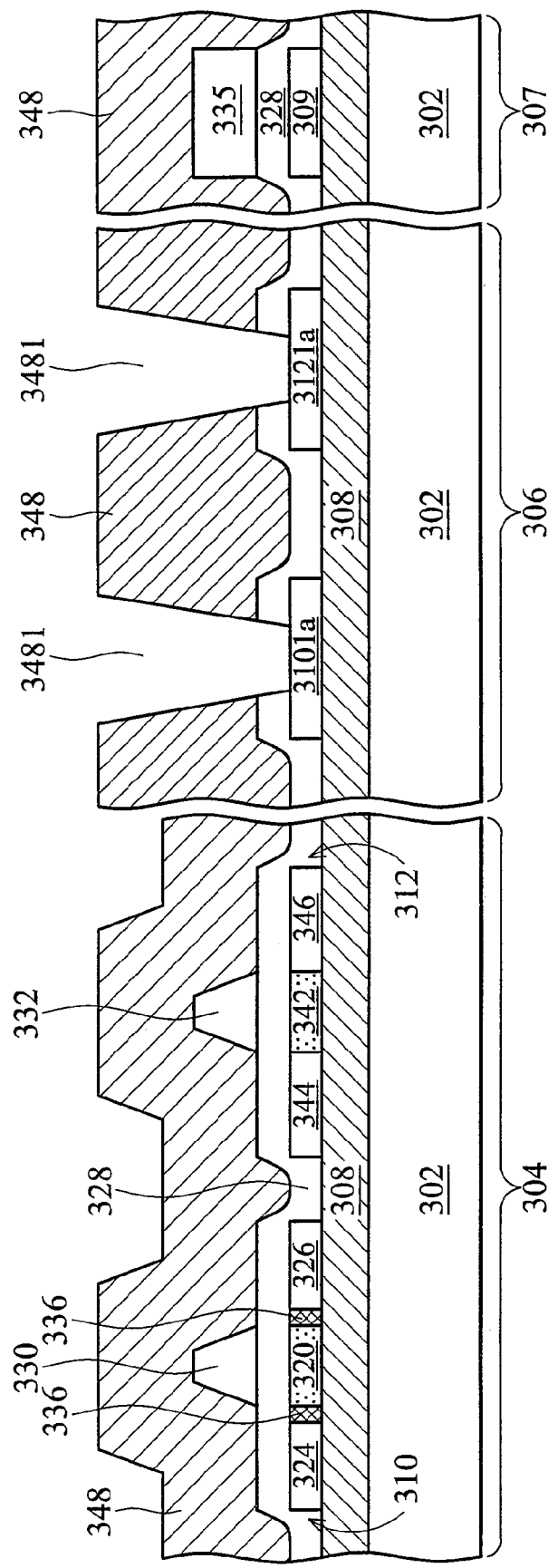
Figure 3J:
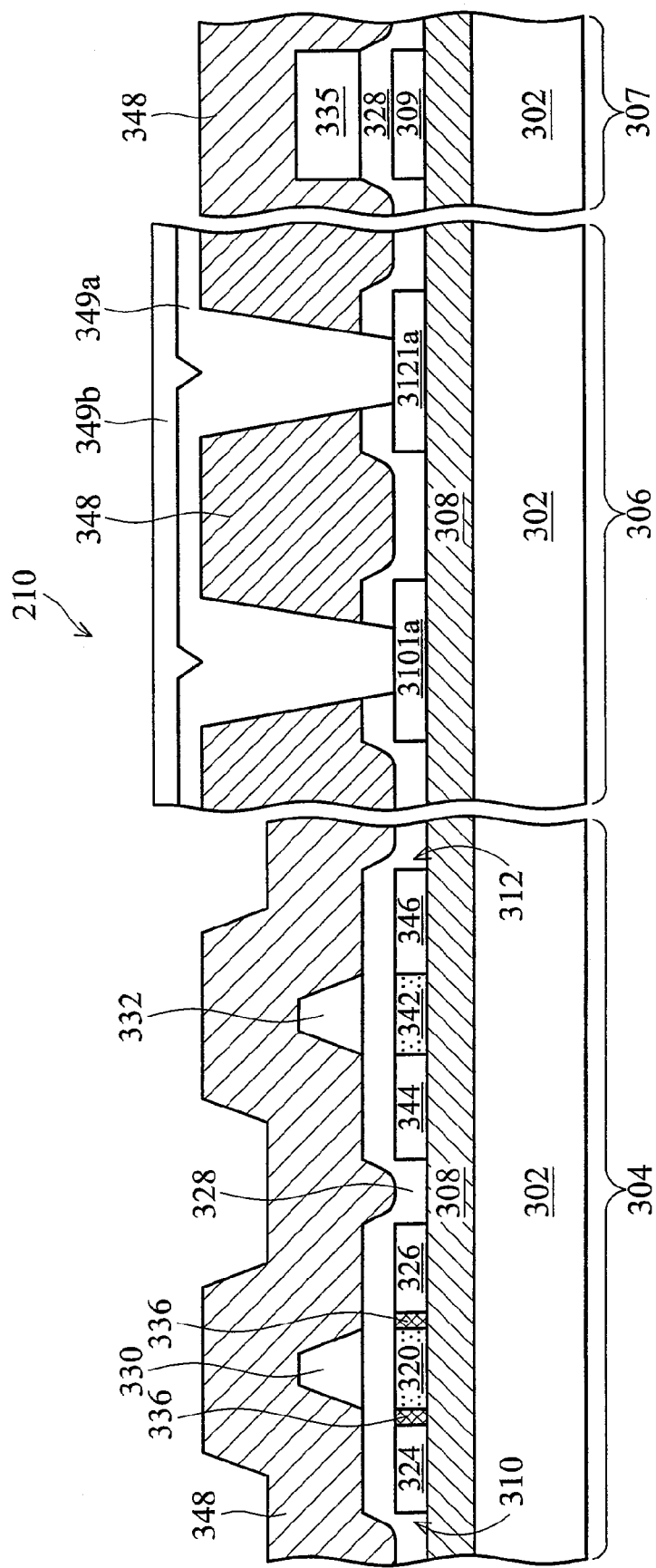
Figure 3K:
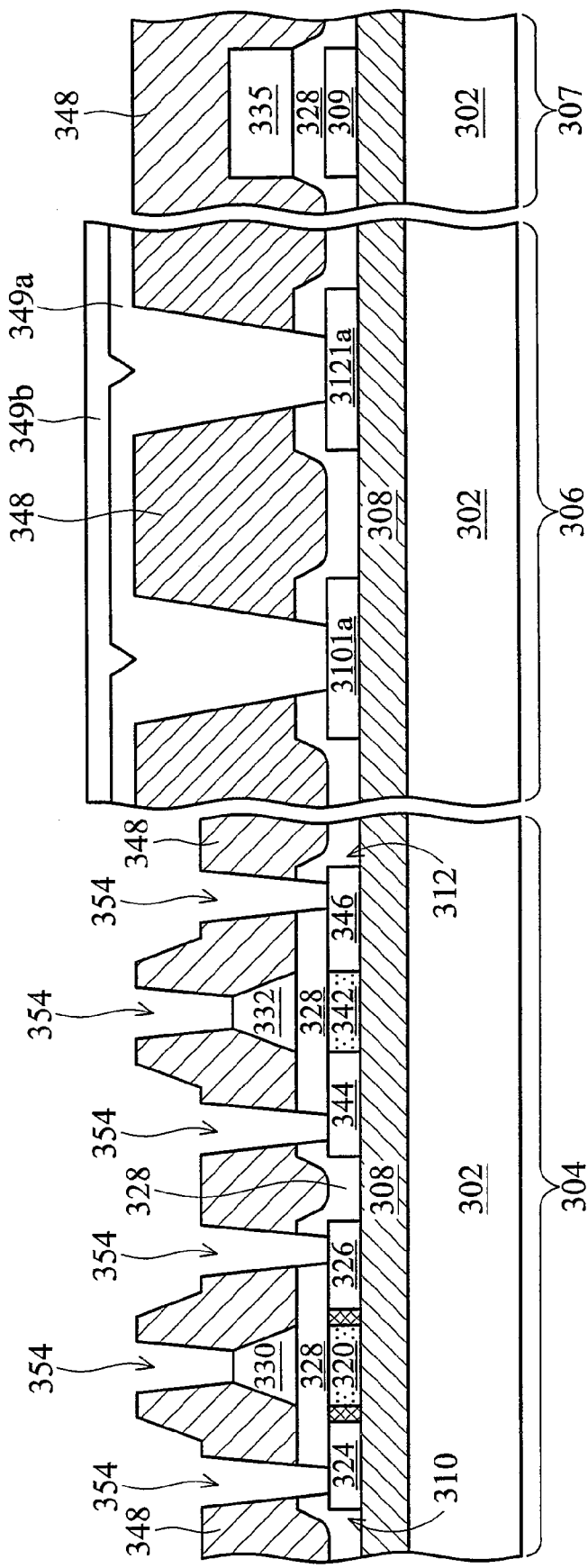
Figure 3L:
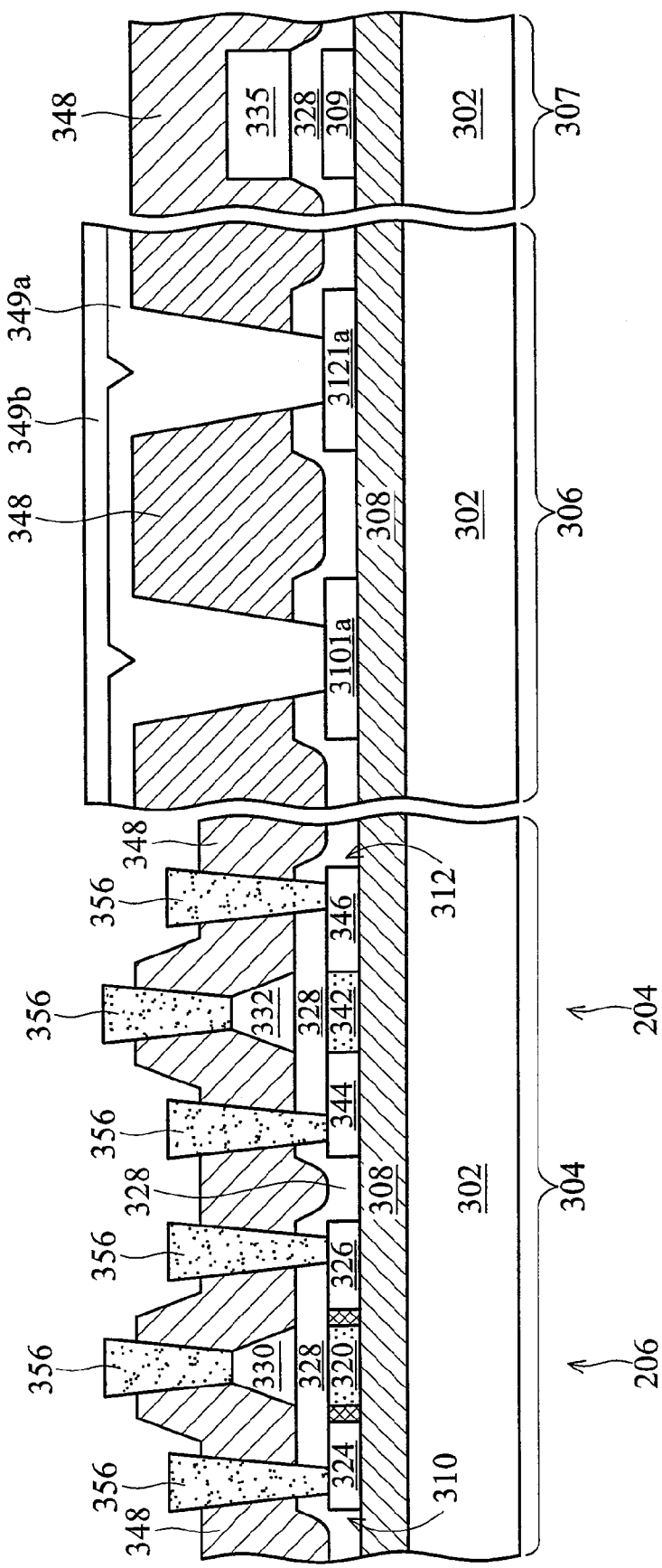
Figure 3M:
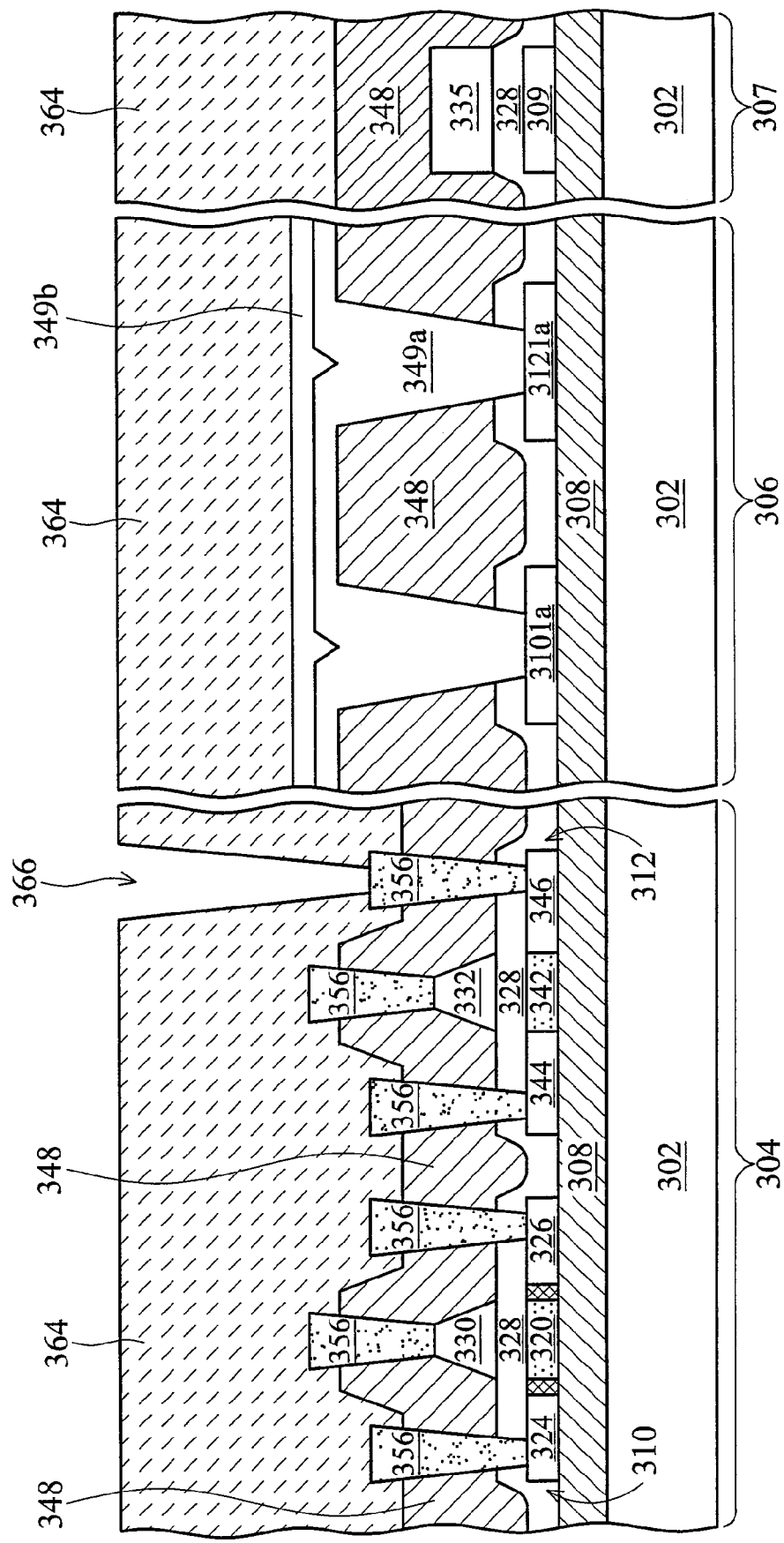
Figure 3N:
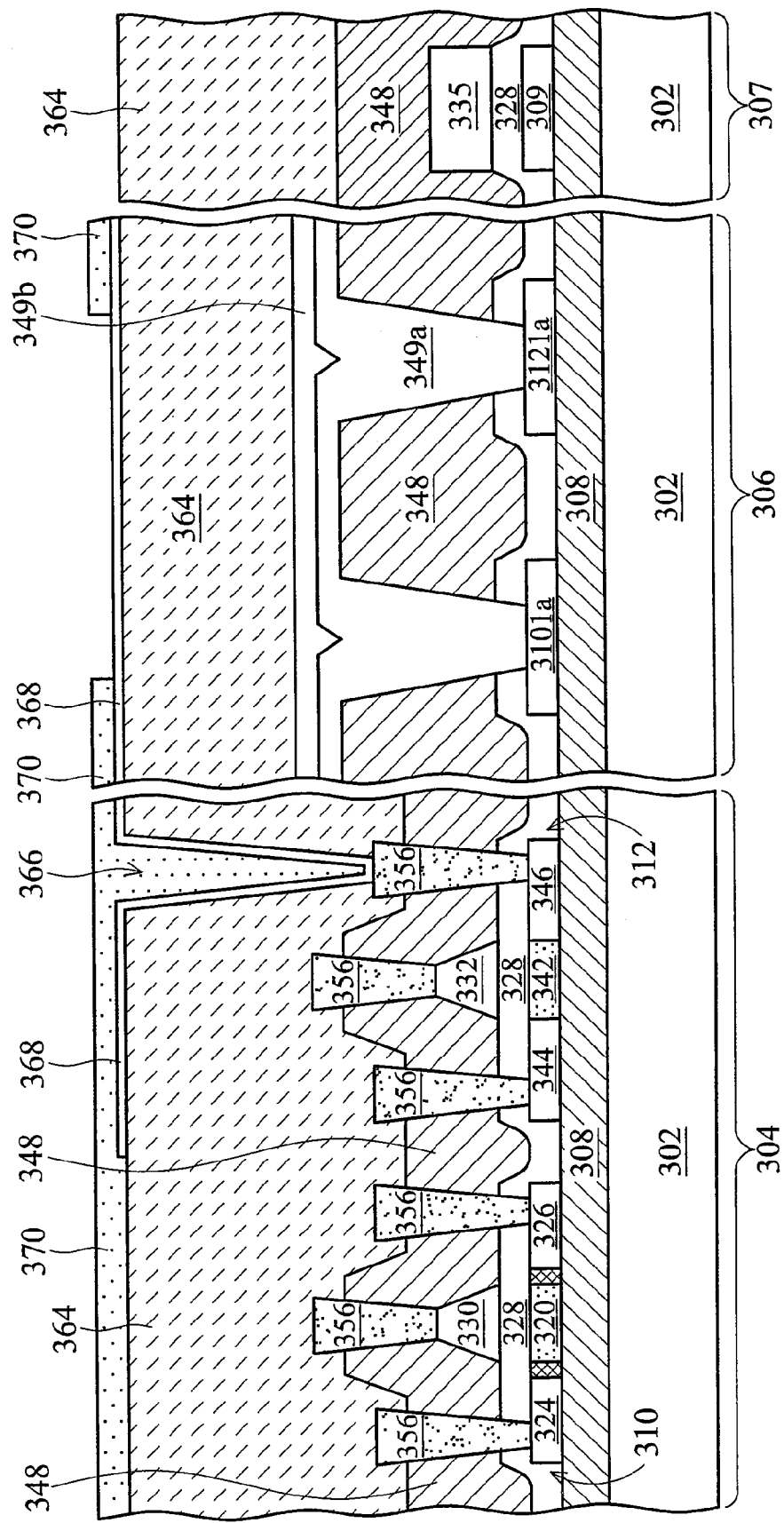
Figure 3O:
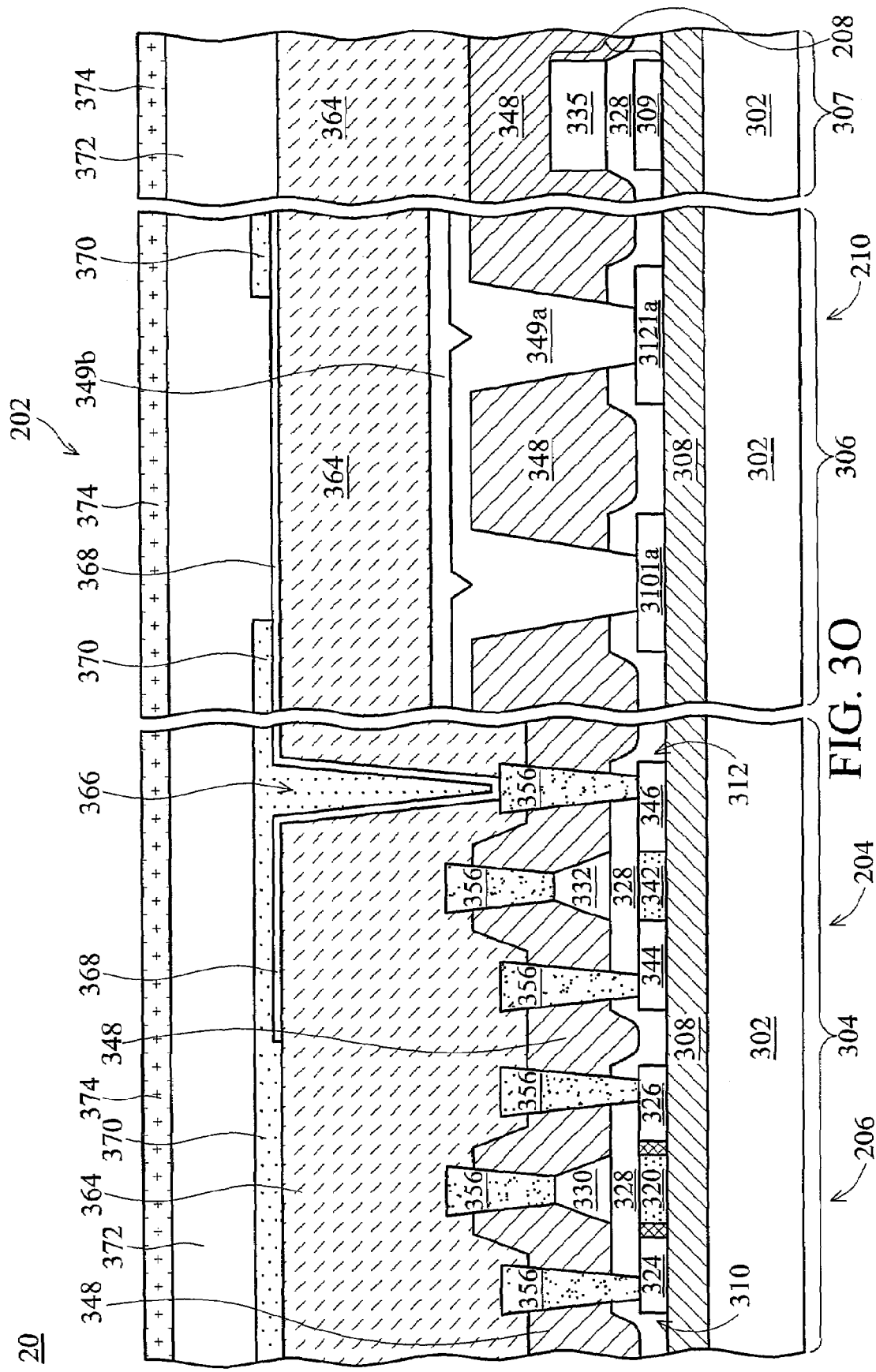

FIG. 3O shows a cross-sectional view of a pixel element 20 of an embodiment of an organic electroluminescent device. FIGS. 3A~3O show an intermediate cross section of an embodiment of an organic electroluminescent device with compensation device. Referring to FIG. 3A, a substrate 302 comprising a control area 304, a sensitive area 306 and a capacitor area 307 is provided, and a buffer layer 308 is formed on the substrate 302. The buffer layer 308 can comprise silicon oxide, silicon nitride, silicon oxynitride or a combination thereof, and preferably is a stack of a silicon oxide layer and a silicon nitride layer. In a preferred embodiment of the invention, thickness of the silicon nitride layer is about 350 Å~650 Å, and thickness of the silicon oxide layer is about 1000 Å~1660 Å.

Next, a conductive layer (not shown) is formed on the buffer layer 308. The conductive layer can comprise polysilicon. For example, an amorphous silicon layer is first formed by deposition with chemical vapor deposition and then crystallized or annealed with excimer laser, ELA to form a polysilicon layer. The conductive layer is defined by conventional lithography and etched to form a first active layer 310, a second active layer 312 overlying the control area 304 of the substrate, a third active layer 3101, a fourth active layer 3121 overing the sensitive area 306, and a bottom electrode 309 overlying the capacitor area 307 of the substrate 302.

Referring to FIG. 3B, the second active layer 312 and the third active layer 3101 are covered by photoresist layers 314, 3141, respectively. A channel dope dopant 316 is implanted into the active layers 310, 3121, and the bottom electrode 309 in which the dopant 316 thereof preferably comprises B+, and the dosage is typically about 0~1E13/cm2.

Referring to FIG. 3C, the third active layer 3101 is covered by a photoresist layer 3141, and the second active layer 312 is covered by a photoresist layer 314. A channel region 320 of the first active layer 310 is covered by another photoresist layer 318, implanting N+ ions 322 into the first active layer 310 to form a source 324 and a drain 326 of an n type transistor. In the meantime, N+ ions are implanted into the exposed fourth active layer 3121, and the bottom electrode 309, thus, an N+ region 3121a of a photo diode (serving as a photo sensor) is formed. In a preferred embodiment of the invention, the N+ ions may comprise phosphorous, and the dosage is preferably about 1E14~1E16 cm2.

Referring to FIG. 3D, the photoresist layers 314, 3141 and 318 are removed, and a gate dielectric layer 328, for example silicon oxide, silicon nitride, silicon oxynitride, a combination thereof, a stack layer thereof or other high K dielectric material, is blanketly deposited on the first active layer 310, the second active layer 312, the third active layer 3101, the N+ region 3121a of a photo diode and the buffer layer 308, and the bottom electrode layer 309 in the capacitor area 307, in which the gate dielectric layer 328 serves as a capacitor dielectric layer in the capacitor area 307. Deposition of the gate dielectric layer 328 comprises CVD.

Referring to FIG. 3E, a gate conductive layer (not shown), for example doped polysilicon or metal, is formed on the gate dielectric layer 328. In a preferred embodiment of the invention, the gate conductive layer is Mo and about 1500 Å~2500 Å thick.

Next, the gate conductive layer is patterned by conventional lithography and etched to form an n type transistor gate 330 overlying the first active layer 310, a p type transistor gate 332 overlying the second active layer 312, and a top electrode 335 overlying the capacitor area 307. Thus, the bottom electrode 309, the gate dielectric layer 328, and the top electrode 335 constitute the capacitor 208 as shown in FIG. 2.

As shown in FIG. 3F, subsequent to the formation of the gate 330 and 332, a light doping (N-doping) 337, for example ion implantation, can be performed to form lightly doped source/drain regions (LDD) 336 on opposite sides of the channel region 320 of the first active layer 310 of the n type transistor. Thus, the switch device 206 of the n type transistor and the driving device 204 of the p type transistor as shown in FIG. 2 are formed in the control area 304. In some embodiments, the switch device 206 and the driving device 204 are top gate transistors.

In FIG. 3G, a photoresist layer 338, 3381 are formed to cover the first active layer 310, the N+ region 3121a of a photo diode, respectively. An ion implantation (P+ doping) 340 is performed to form source 344 and drain 346 on opposite sides of the channel region 342 of the p type transistor, and to form an P+ region 3101a of a photo diode.

Next, referring to FIG. 3H, the photoresist layer 338 and 3381 are removed. A dielectric layer 348 is blanketly deposited on the gate dielectric layer 328 overlying the control area 304, the n type transistor gate 330, the p type transistor gate 332, the N+ region 3121a and the P+ region 3101a of a photo diode overlying the sensitive area 306, and the top electrode 335 overlying the capacitor area 307.

Generally, the thickness and composition of the dielectric layer 348 can be determined according to product spec or process window. For example, the dielectric layer 348 may include silicon dioxide, polyimide, spin-on-glass (SOG), fluoride-doped silicate glass (FSG), Black Diamond (a product of Applied Materials of Santa Clara, Calif.), Xerogel, Aerogel, amorphous fluorinated carbon, and/or other materials. In a preferred embodiment of the invention, the dielectric layer 348 is a stack layer of silicon oxide and silicon nitride, and more preferably a lower nitride layer/oxide layer/higher nitride layer structure, in which the lower nitride layer is about 2500~3500 Å thick, the oxide layer is about 2500~3500 Å thick and the higher nitride layer is about 500~1500 Å thick. Formation of the dielectric layer 348 comprises CVD. In addition, a rapid thermal annealing is conducted to activate the dopants.

As shown in FIG. 3I, by means of sequential patterning and etching processes, a contact hole 3481 is defined and etched through the dielectric layer 348 and the gate dielectric layer 328 overlying the sensitive area 306. The etching comprises a dry etching or a wet etching.

As shown in FIG. 3J, by means of CVD, a conductive film 349a such as an a-Si film and a dielectric film 349b are formed over the sensitive area 306 in sequence. The conductive film 349a fills the contact hole 3481 and overlies the dielectric layer 348. The dielectric film 349b covers the conductive film 349a. The preferred thickness of the conductive film 349a or the dielectric film 349b is 5000 and 3000 angstroms, respectively. The conductive film 349a can be amorphous silicon or polysilicon. The dielectric film 349b can be silicon nitride or silicon oxide. In other embodiments, an a-Si photo diode region is patterned and etched by etching after formation of the conductive film 349a and the dielectric film 349b, thus, the photo sensor 210 as shown in FIG. 2 is formed. The etching process comprises dry etching and wet etching processes. The photo sensor 210 can be a lateral a-Si diode in this embodiment while it can be a vertical diode in other embodiment.

As shown in FIG. 3K, the dielectric layer 348 and the gate dielectric layer 328 are patterned by conventional photolithography and etched to form a plurality of openings 354, exposing the source 324, gate 330 and drain 326 of the n type transistor and the source 344, gate 332 and drain 346 of the p type transistor respectively for connection to metal lines in subsequent processes.

Next, referring to FIG. 3L, a metal layer (not shown) is blanketly deposited, and then patterned by conventional photolithography and etching to form conductive contacts 356 in the openings 354. According to some embodiments of the present invention, the switch device and the driving device can have gates of the same layer. For example, referring to FIG. 3L, the gate 330 of the switch device 206 and the gate 332 of the driving device 204 are of the same layer. The metal layer is a stack of Mo/Al/Mo, each layer with a thickness of 500, 4000, 500 angstroms, respectively.

Referring to FIG. 3M, a planarization layer 364 for example organic or oxide, is formed on the passivation layer 362. Preferably, the planarization layer 364 is about 10000 Å~50000 Å thick. The planarization layer 364 and the passivation layer 362 is patterned by conventional lithography and etched to form contact openings 366 corresponding to the conductive contacts 356. In a preferred embodiment of the invention, the contact opening 366 exposes the conductive contact 356 of the drain 346 of the p type transistor.

Referring to FIG. 3N, a pixel electrode layer 368 (serving as an anode), for example indium tin oxide (ITO), is formed on the planarization layer 364, electrically connecting the conductive contacts 356. Next, a pixel definition layer 370, for example organic or oxide, is formed on a portion of the planarization layer 364 and the pixel electrode layer 368. The pixel definition layer 370 is then patterned to expose a portion of or the entire photo sensor 210.

Referring to FIG. 3O, an organic light emitting layer (OLED layer) 372 is formed overlying the pixel electrode layer 368 and the pixel definition layer 370. In an embodiment of the invention, the organic light emitting layer 372 disposed overlying the pixel electrode layer 368 (also referred to as an anode layer) comprises a hole-injecting layer, a hole-transport layer, an organic luminescent material layer, an electron-transport layer, and an electron-injecting layer sequentially. The anode layer can be indium tin oxide (In2O3:Sn, ITO) which has advantages of facile etching, low film-formation temperature and low resistance. When a bias voltage is applied to the OLED element, an electron and a hole passing through the electron-transport layer and the hole-transport layer respectively enter the organic luminescent material layer to combine as an exciton and then release energy to return to ground state. Particularly, depending on the nature of the organic luminescent material, the released energy presents different colors of light including red (R), green (G) and blue (B).

Next, a cathode 374 is formed on the organic light emitting layer 372. The cathode 374 can be a reflective layer, for example Al, Ag or other suitable material with high reflectivity. Thus, the pixel electrode layer 368, the organic light emitting layer 372, and the cathode 374 constitute the organic electroluminescent element (OLED element) 202 as shown in FIG. 2. A bottom emission organic electroluminescent device is thus formed.

Figure 4:
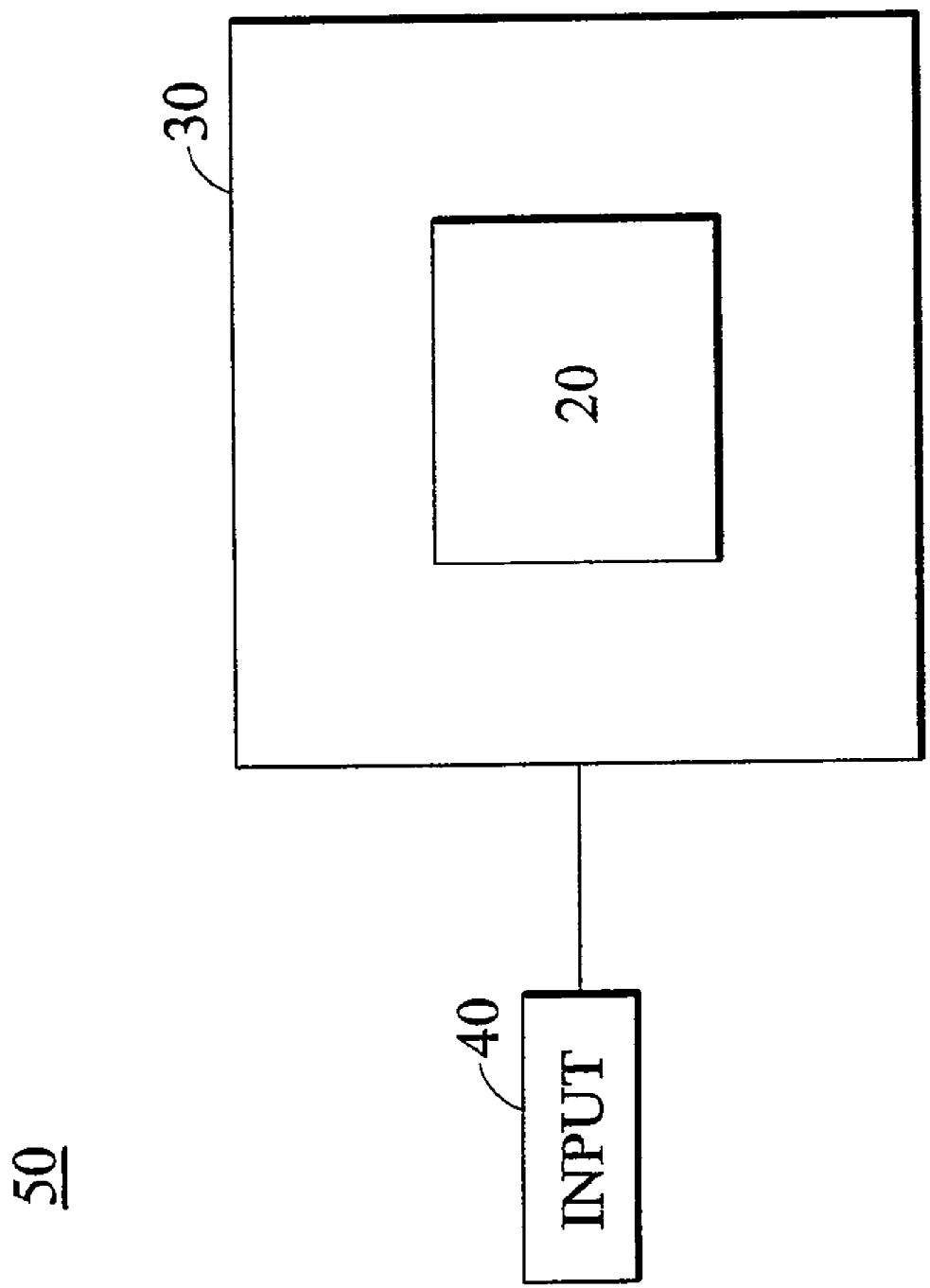
FIG. 4 shows that the pixel element 20 shown in FIG. 2 or FIG. 3N can be incorporated into a panel (in this case, panel 30) such as an OLED panel.

As shown in FIGS. 2 and 3O, according to some embodiments of the invention, photo current is generated in the photo sensor 210 when OLED element 202 illuminates the photo sensor 210. The level of photo current is depending on the brightness of the OLED element 202. Consequently, the voltage of the capacitor 208 coupled to the driving device 204 is adjusted to control the current passing through the driving device 204 according to illumination of the organic electroluminescent element 202 detected by the photo sensor 210. Thus, illumination of the organic electroluminescent element 202 is changed for compensation. This internal compensation can maintain brightness uniformity of the OLED element after long term use. FIG. 4 shows that the pixel element 20 shown in FIG. 2 or FIG. 3O can be incorporated into a display panel (in this case, panel 30) that can be an OLED panel. The panel can form a portion of a variety of electronic devices (in this case, electronic device 50). Generally, the electronic device 50 comprises the OLED panel 30 and an input unit 40. Further, the input unit 40 is operatively coupled to the OLED panel 30 and provides input signals (e.g., image signal) to the panel 30 to generate images. The electronic device can be a PDA (personal digital assistant), notebook computer, tablet computer, cellular phone, car TV, or digital camera, etc.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electroluminescent device, comprising a pixel element, the pixel element comprising;
   a substrate, comprising a control area and a sensitive area;
   a switch device and a driving device overlying the control area, wherein the switch device has a first active layer, the driving device has a second active layer, wherein the first and second active layers are polysilicon layers;
   a photo diode overlying the sensitive area, wherein the photo diode serves as a photo sensor, wherein the photo diode comprises: a third active layer, a fourth active layer, and a fifth active layer, wherein the fifth active layer is connected to both the third and fourth active layers;
       an OLED element disposed in the sensitive area and illuminating to the photo sensor;
       a capacitor coupled to the photo sensor and the driving device;
   a gate dielectric layer disposed overlying the first, the second, the third and the fourth active layers;
   a first gate and a second gate disposed on the gate dielectric layer overlying the control area, wherein the first gate is in the switch device, and the second gate is in the driving device; and
   an interlayer dielectric layer disposed on the gate dielectric layer overlying the sensitive area, the interlayer dielectric layer having a plurality of first openings therein to expose the third and fourth active layers, wherein the first openings are filled with the fifth active layer;
   wherein a photo current corresponding to a brightness of the OLED element is generated by the photo diode responsive to the OLED element illuminating the photo diode such that a voltage of the capacitor is adjusted by the photo current to control the current passing through the driving device, thus changing the illumination of the OLED element.

2. The organic electroluminescent device as claimed in claim 1, wherein the switch device and the driving device are top gate transistors.

3. The organic electroluminescent device as claimed in claim 1, wherein the photo diode is a lateral photo diode.

4. The organic electroluminescent device as claimed in claim 1, wherein the third and fourth active layers are polysilicon.

5. The organic electroluminescent device as claimed in claim 4, wherein the third and fourth active layers are of different conductivity types.

6. The organic electroluminescent device as claimed in claim 5, wherein the third active layer is of P-type conductivity and the fourth active layer is of N-type conductivity.

7. The organic electroluminescent device as claimed in claim 1, wherein the fifth active layer is amorphous silicon.

8. The organic electroluminescent device as claimed in claim 7, wherein the fifth active layer has a thickness of between 4500~5500 Å.

9. The organic electroluminescent device as claimed in claim 1, wherein the interlayer dielectric layer further comprises a plurality of second openings, exposing the first and second gates and a portion of the first and second active areas, and the second openings are filled with conductive contacts.

10. The organic electroluminescent device as claimed in claim 1, wherein the device is a display panel.

11. The organic electroluminescent device as claimed in claim 10, further comprising an electronic device, wherein the electronic device comprises;

the display panel; and an input unit coupled to the display panel and operative to provide input to the display panel such that the display panel displays images.

* * * * *